(12) United States Patent
Bukhamseen et al.

(10) Patent No.: US 11,821,289 B2
(45) Date of Patent: Nov. 21, 2023

(54) AUTOMATED PRODUCTION OPTIMIZATION TECHNIQUE FOR SMART WELL COMPLETIONS USING REAL-TIME NODAL ANALYSIS

(71) Applicant: Saudi Arabian Oil Company, Dhahran (SA)

(72) Inventors: Ahmed Y. Bukhamseen, Dammam (SA); Amer Alanazi, Dammam (SA); Abdulaziz Al-Qasim, Dammam (SA)

(73) Assignee: Saudi Arabian Oil Company, Dhahran (SA)

(*) Notice: Subject to any disclaimer, the term of this patent is extended or adjusted under 35 U.S.C. 154(b) by 543 days.

(21) Appl. No.: 16/687,077

(22) Filed: Nov. 18, 2019

(65) Prior Publication Data

US 2021/0148196 A1    May 20, 2021

(51) Int. Cl.
*E21B 41/00* (2006.01)
*G06F 30/27* (2020.01)
(Continued)

(52) U.S. Cl.
CPC .......... *E21B 41/0092* (2013.01); *E21B 34/16* (2013.01); *E21B 47/06* (2013.01);
(Continued)

(58) Field of Classification Search
CPC ...... E21B 41/0092; E21B 34/16; E21B 47/06; E21B 47/10; E21B 43/14; E21B 2200/20;
(Continued)

(56) References Cited

U.S. PATENT DOCUMENTS 6,012,015 A    1/2000  Tubel et al.
6,789,628 B2   9/2004  Hess et al.
(Continued)

FOREIGN PATENT DOCUMENTS

WO    WO2015153680 A1 *  4/2014
WO    2014160626           10/2014
(Continued)

OTHER PUBLICATIONS

Carvajal, G. A., Boisvert, I . . . , and S . . . Knabe. "A Smart Flow for SmartWells: Reactive and Proactive Modes." Paper presented at the SPE Intelligent Energy Conference & Exhibition, Utrecht, The Netherlands, Apr. 2014. doi: https://doi.org/10.2118/167821-MS (Year: 2014).*

(Continued)

*Primary Examiner* — Brian S Cook
(74) *Attorney, Agent, or Firm* — Fish & Richardson P.C.

(57) ABSTRACT

Systems and methods include a method for multi-segmented oil production. A multi-segmented well production model representing production at a multi-segmented oil production facility is calibrated. The model models production based on well rates and flowing bottom-hole pressure data at various choke settings for multiple flow conditions for each segment of the multi-segmented well. Real-time updates to the well rates and the flowing bottom-hole pressure data are received. Changes to triggers identifying thresholds for identifying production improvements are received. The model is re-calibrated based on the changes to the triggers and the real-time updates. An optimization algorithm is executed to determine new optimal inflow control valve (ICV) settings. Using the re-calibrated multi-segmented well production model, a determination is made whether the new optimal ICV settings improve production. If so, the optimal ICV (Continued)

settings are provided to a control panel for the multi-segmented oil production facility.

20 Claims, 7 Drawing Sheets

(51) Int. Cl.
| | |
|---|---|
| *E21B 34/16* | (2006.01) |
| *E21B 47/06* | (2012.01) |
| *E21B 47/10* | (2012.01) |
| *G05B 13/00* | (2006.01) |
| *G05B 17/00* | (2006.01) |
| *G05B 19/00* | (2006.01) |
| *G06N 5/02* | (2023.01) |
| *E21B 43/04* | (2006.01) |

(52) U.S. Cl.
CPC ............. *E21B 47/10* (2013.01); *G05B 13/00* (2013.01); *G05B 17/00* (2013.01); *G05B 19/00* (2013.01); *G06F 30/27* (2020.01); *G06N 5/02* (2013.01); *E21B 43/04* (2013.01); *E21B 2200/20* (2020.05)

(58) Field of Classification Search
CPC . E21B 2200/22; E21B 41/0035; G05B 13/00; G05B 17/00; G05B 19/00; G06F 30/27; G06N 5/02
USPC .......................................................... 703/10
See application file for complete search history.

(56) References Cited

U.S. PATENT DOCUMENTS

| | | | |
|---|---|---|---|
| 8,290,632 B2 | 10/2012 | Briers et al. | |
| 8,463,585 B2 | 6/2013 | Sun et al. | |
| 8,788,209 B2 | 6/2014 | Foot et al. | |
| 8,914,268 B2 | 12/2014 | Dale et al. | |
| D741,882 S | 10/2015 | Shmilov et al. | |
| 9,235,838 B2 * | 1/2016 | Gerardi .................. | E21B 34/16 705/51 |
| D749,623 S | 2/2016 | Gray et al. | |
| D750,129 S | 2/2016 | Kwon | |
| 9,323,252 B2 | 4/2016 | Slupphaug et al. | |
| D755,196 S | 5/2016 | Meyers et al. | |
| D756,373 S | 5/2016 | Raskin et al. | |
| D757,028 S | 5/2016 | Goldenberg et al. | |
| D759,063 S | 6/2016 | Chen | |
| 9,394,769 B2 | 7/2016 | Nenniger et al. | |
| D763,277 S | 8/2016 | Ahmed et al. | |
| D764,501 S | 8/2016 | Dias et al. | |
| D767,624 S | 9/2016 | Lee et al. | |
| D768,152 S | 10/2016 | Gutierrez et al. | |
| D771,116 S | 11/2016 | Dellinger et al. | |
| D7,704,765 | 11/2016 | Jitkoff et al. | |
| D776,683 S | 1/2017 | Gobinski et al. | |
| D777,177 S | 1/2017 | Chen et al. | |
| D779,514 S | 2/2017 | Baris et al. | |
| D785,022 S | 4/2017 | Vasquez et al. | |
| D782,526 S | 5/2017 | Rind et al. | |
| D786,280 S | 5/2017 | Ma | |
| D786,896 S | 5/2017 | Kim et al. | |
| D788,123 S | 5/2017 | Shan et al. | |
| D788,128 S | 5/2017 | Wada | |
| D788,792 S | 6/2017 | Alessandri et al. | |
| 9,745,833 B2 | 8/2017 | Carvajal | |
| D798,886 S | 10/2017 | Prophete et al. | |
| D800,742 S | 10/2017 | Rhodes | |
| D800,744 S | 10/2017 | Jitkoff et al. | |
| D803,235 S | 11/2017 | Markson et al. | |
| D805,525 S | 12/2017 | Dascola et al. | |
| D806,108 S | 12/2017 | Day et al. | |
| D807,900 S | 1/2018 | Raji et al. | |
| D808,981 S | 1/2018 | Hazam et al. | |
| 9,864,353 B2 | 1/2018 | Tonkin et al. | |
| D822,678 S | 7/2018 | Wu et al. | |
| D823,326 S | 7/2018 | Garcia et al. | |
| D823,860 S | 7/2018 | Wiffen et al. | |
| D830,382 S | 10/2018 | Marohn | |
| D833,459 S | 11/2018 | Blechschmidt et al. | |
| D841,017 S | 2/2019 | Bathla | |
| D849,014 S | 5/2019 | Senders | |
| D853,412 S | 7/2019 | Hofner et al. | |
| D854,030 S | 7/2019 | Dascola et al. | |
| D888,739 S | 6/2020 | Christiana et al. | |
| D905,734 S | 12/2020 | Christiana et al. | |
| D906,358 S | 12/2020 | Christiana et al. | |
| 10,982,516 B2 | 4/2021 | Arukhe et al. | |
| 11,188,209 B2 | 11/2021 | Kaufthal et al. | |
| D938,974 S | 12/2021 | Wang et al. | |
| D941,849 S | 1/2022 | Knowles et al. | |
| 11,243,976 B2 | 2/2022 | Beckham et al. | |
| 11,250,176 B2 | 2/2022 | Schwartz et al. | |
| 2005/0121190 A1 | 6/2005 | Oberkircher et al. | |
| 2007/0168056 A1 | 7/2007 | Shayegi et al. | |
| 2008/0236839 A1 | 10/2008 | Oddie | |
| 2008/0262737 A1 | 10/2008 | Thigpen et al. | |
| 2009/0308601 A1 | 12/2009 | Poe et al. | |
| 2010/0005411 A1 | 1/2010 | Duncket et al. | |
| 2010/0217575 A1 | 8/2010 | Briers et al. | |
| 2011/0042083 A1 | 2/2011 | Sierra et al. | |
| 2011/0301851 A1 | 12/2011 | Briers et al. | |
| 2012/0095603 A1 | 4/2012 | Rashid et al. | |
| 2012/0194558 A1 | 8/2012 | Dykes et al. | |
| 2014/0039793 A1 | 2/2014 | Querales | |
| 2014/0358511 A1 | 12/2014 | Waage et al. | |
| 2016/0054713 A1 | 2/2016 | Foss et al. | |
| 2016/0061003 A1 | 3/2016 | Gottumukkala et al. | |
| 2016/0273315 A1 | 9/2016 | Carvajal et al. | |
| 2016/0312552 A1 | 10/2016 | Early et al. | |
| 2016/0328497 A1 | 11/2016 | Hamza et al. | |
| 2016/0369590 A1 | 12/2016 | Tonkin et al. | |
| 2017/0081950 A1 | 3/2017 | Filatyev et al. | |
| 2017/0177761 A1 | 6/2017 | Early et al. | |
| 2018/0030816 A1 | 2/2018 | Devalve et al. | |
| 2018/0066515 A1 | 3/2018 | Balan et al. | |
| 2018/0119533 A1 | 5/2018 | Alhuthali et al. | |
| 2018/0285515 A1 | 10/2018 | Isichei | |
| 2018/0347326 A1 | 12/2018 | Shammari et al. | |
| 2020/0242497 A1 | 7/2020 | Shahkarami et al. | |
| 2020/0362670 A1 | 11/2020 | Alanazi et al. | |
| 2020/0362674 A1 | 11/2020 | Alanazi et al. | |
| 2020/0362697 A1 | 11/2020 | Alanazi et al. | |
| 2021/0102446 A1 | 4/2021 | Alghazali | |
| 2021/0277747 A1 | 9/2021 | Al Naimi et al. | |

FOREIGN PATENT DOCUMENTS

| | | |
|---|---|---|
| WO | WO 2015153680 | 10/2015 |
| WO | 2016205158 | 12/2016 |
| WO | WO 2016195846 | 12/2016 |
| WO | WO 2020232218 | 11/2020 |

OTHER PUBLICATIONS

Das, Om Prakash, and Khalaf Al-Enezi. "A Novel Workflow for Intelligent Well Inflow Control Valve Design by Integrating Reservoir Dynamics to Facilitate Proactive Reservoir Management in Minagish Field, West Kuwait." Paper presented at the SPE Annual Technical Conference and Exhibition, Amsterdam (Year: 2014).*
Su, Ho-Jeen, and Dean S. Oliver. "Smart-well production optimization using an ensemble-based method." SPE Reservoir Evaluation & Engineering 13.06 (2010): 884-892. (Year: 2010).*
Schmidt_2017 (CPSC 540: Machine Learning Rates of Convergence, University of British Columbia Winter 2017). (Year: 2017).*
PCT International Search Report and Written Opinion in International Appln. No. PCT/US2020/060864, dated Mar. 3, 2021, 19 pages.
Abukhamsin et al., "Inflow profiling and production optimization in smart wells using distributed acoustic and temperature measure-

(56) References Cited

OTHER PUBLICATIONS ments," A dissertation submitted to the Department of Energy Resources Engineering the Committee on Graduate Studies of Stanford University, Jun. 2017, 190 pages.

Bukhamsin et al., "Optimization of multilateral well design and location in a real field using a continuous genetic algorithm," SPE 136944, presented at the SPE/DGS Annual Saudi Arabia Section Technical Symposium and Exhibition, Apr. 4-7, 2010, 16 pages.

Cetkovic et al., "A methodology for multilateral wells optimization—field case study," SPE 183004, presented at the Abu Dhabi International Petroleum Exhibition & Conference, Abu Dhabi, UAE, Nov. 7-10, 2016, 18 pages.

PCT International Search Report and Written Opinion in International Appln. No. PCT/US2020/032831, dated Aug. 11, 2020, 16 pages.

PCT International Search Report and Written Opinion in International Appln. No. PCT/US2020/032835, dated Aug. 11, 2020, 16 pages.

GCC Examination Report in GCC Appln. No. GC 2020-39758, dated Nov. 4, 2021, 4 pages.

GCC Examination Report in GCC Appln. No. GC 2020-39751, dated Aug. 19, 2021, 4 pages.

PCT International Search Report and Written Opinion in International Appln. No. PCT/US2020/032833, dated Aug. 11, 2020, 16 pages.

Sampaio et al., "Optimization of proactive control valves of producer and injector intelligent wells under economic uncertainty," presented at the SPE Europec/EAGE Annual Conference, Copenhagen, Denmark, Jun. 2012, 13 pages.

GCC Examination Report in GCC Appln. No. GC 2020-39756, dated Aug. 23, 2021, 5 pages.

Al-Anazi et al., "Innovative Production Optimization Technique for Smart Well Completions Using Real-Time Nodal Analysis Applications," SPE-189198-MS, presented at the SPE Symposium: Production Enhancement and Cost Optimisation held in Kuala Lumpur, Malaysia, Nov. 7-8, 2017, 14 pages.

Brouwer et al., "Recovery Increase through Water Flooding with Smart Well Technology," SPE 68979 presented at the SPE European Formation Dmage Conference, The Netherlands, May 21-22, 2001, 10 pages.

Edabi and Davies, "Techniques for Optimum Placement of Interval Control Valve(s) in an Intelligent Well," SPE 100191 presented at the SPE Europec/EAGE Annual Conference and Exhibition, Austria, Jun. 12-15, 2006, 11 pages.

Elmsallati and Davies, "Automatic Optimization of Infinite Variable Control Valves," IPTC-10319, presented at the International Petroleum Technology Conference, Qatar, Nov. 21-23, 2005, 7 pages.

Farshi, "Improving Genetic Algorithms for Optimum Well Placement," Master's Report, Department of Energy Resources Engineering, Stanford University, California, Jun. 2008, 94 pages.

Ghosh and King, "Optimization of Smart Well Completion Design in the Presence of Uncertainty," SPE 166008, presented at the SPE Reservoir Characterization and simulation Conference and Exhibition held in Abu Dhabi, Sep. 16-18, 2013, 17 pages.

Glandt, "Reservoir Aspects of Smart Wells," SPE 81107 presented at the SPE Latin America and Caribbean Petroleum Engineering Conference, Trinidad, Apr. 27-30, 2003, 11 pages.

Haupt and Haupt, "Practical Genetic Algorithms," 2nd Edition, John Wiley & Sons, New York, 2004, 261 pages.

Holland, "Genetic algorithms," Scientific American, pp. 66-79, Jul. 1992, 14 pages.

Jalali et al., "Intelligent Completion System—The Reservoir Rationale," SPE 50587, presented at the SPE European Petroleum Conference, The Netherlands, Oct. 20-22, 1998, 6 pages.

Lorenz et al., "Uniform Inflow Completion System Extended Economic Field Life: A Field Case Study and Technology Overview," SPE 101895, presented at the SPE Annual Technical Conference and Exhibition, Texas, Sep. 24-27, 2006, 9 pages.

Mitchell, "An Introduction to Genetic Algorithms," Chapter 1-4, Chapter 6, Appendix A-B, Mit Press, 1996, 162 pages.

Naus et al., "Optimization of Commingled Production using Infinitely Variable Inflow Control Valves," SPE 90959, presented at the SPE Annual Technical Conference and Exhibition, Texas, Sep. 26-29, 2004, 12 pages.

Radcliff, "Formal Analysis and Random Respectful Recombination," proceedings of 4th International Conference and Genetic Algorithms, San Mateo, CA, 1991, 9 pages.

Rudolph, "Convergence Analysis of Canonic Genetic Algorithms," IEEE Transactions on Neuroal Networks, special issue on Evolutionary Computational vol. No. 1, Jan. 1994, 6 pages.

Sinha et al., "Flow Equilibration Toward Horizontal Well Using Downhole Valves," SPE 68635 presented at the SPE Asia Pacific Oil and Gas Conference and Exhibition, Indonesia, Apr. 17-19, 2001, 6 pages.

Yeten and Jalali, "Effectiveness of Intelligent Completions in a Multiwell Development," 2001 SPE Middle East Oil Show, Bahrain, Mar. 17-20, 2017 pages.

GCC Examination Report in GCC Appln. No. GC 2020-40905, dated Oct. 18, 2021, 4 pages.

Al-Ghareeb, "Monitoring and control of smart wells," A report submitted to the Department of Energy Resources Engineering of Stanford University, 86 pages.

Ranjith et al., "Production Optimization Through Utilization of Smart Wells in Intelligent Fields," SPE 185709, presented at the SPE Western Regional Meeting, Bakersfield, CA, Apr. 23, 2017, 29 pages.

Alghareeb et al., "Proactive Optimization of Oil Recovery in Multilateral Wells Using Real Time Production Data," SPE 124999, presented at the SPE Annual Technical Conference and Exhibition, New Orleans, Louisiana, Oct. 2009, 16 pages.

\* cited by examiner

AUTOMATED PRODUCTION OPTIMIZATION TECHNIQUE FOR SMART WELL COMPLETIONS USING REAL-TIME NODAL ANALYSIS

BACKGROUND

The present disclosure applies to optimization of well production.

Many conventional wells (for example, oil wells) are instrumented with downhole sensors and valves that enable real-time monitoring and control of multi-segmented (for example, multi-lateral) completions. However, engineers seldom utilize the downhole valves to adjust the production from a particular zone in a timely manner. Even if such adjustments do occur, the process can be cumbersome and is typically based on trial and error.

SUMMARY

The present disclosure describes techniques that include real-time nodal analysis to automate production optimization for smart well completions. For example, the techniques can use modeling techniques that combine segment production data and estimations of downhole parameters to provide optimum inflow control valve (ICV) settings to improve the performance of multi-segmented (for example, multi-lateral) wells. Optimum settings can be defined, for example, as settings that maximize the production of a multi-segmented well over a period of time. In some implementations, automated model optimization can be used to perform optimizations in real-time. For example, the term real-time can correspond to events that occur within a specified period of time, such as within one minute, within one second, or within milliseconds.

In some implementations, a computer-implemented method includes the following. A multi-segmented well production model representing production at a multi-segmented oil production facility is calibrated. The multi-segmented well production model models production based on well rates and flowing bottom-hole pressure data at various choke settings for multiple flow conditions for each segment of the multi-segmented well. Real-time updates to the well rates and the flowing bottom-hole pressure data are received from the multi-segmented oil production facility. Changes to triggers identifying thresholds for identifying production improvements are received based on user inputs. The multi-segmented well production model is re-calibrated based on the changes to the triggers and the real-time updates to the well rates and the flowing bottom-hole pressure data. Using the re-calibrated nodal model, an optimization algorithm is executed to determine new optimal inflow control valve (ICV) settings. Using the re-calibrated multi-segmented well production model, a determination is made whether the new optimal ICV settings improve production at the multi-segmented oil production facility. In response to determining that the new optimal ICV settings improve production, the optimal ICV settings are provided to a control panel for the multi-segmented oil production facility.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method/ the instructions stored on the non-transitory, computer-readable medium.

The subject matter described in this specification can be implemented in particular implementations, so as to realize one or more of the following advantages. First, immediate system adjustment can be made automatically in response to changes in production conditions. This can provide improvements over manual practices, for example, in which changes are implemented after a manual review, which can results in unfavorable well settings. By comparison, automatic system adjustments can increase cumulative oil well production. Second, conventional optimization procedures of multi-segmented ICVs can be cumbersome and may only optimize initial production conditions. This can create issues in the later life of the well when, for example, the initial ICV settings are no longer optimal. Third, the use of the techniques of the present disclosure can facilitate better management, by production engineers, of multi-segmented well production, for example, fulfilling both short- and long-term objectives for optimizing well production and improving recovery. Moreover, a reduction of operating expenditures (OPEX) can be realized. Fourth, the value added from smart well completion (SWC) can provide operational savings over conventional practices.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

Like reference numbers and designations in the various drawings indicate like elements.

DETAILED DESCRIPTION

Figure 1:
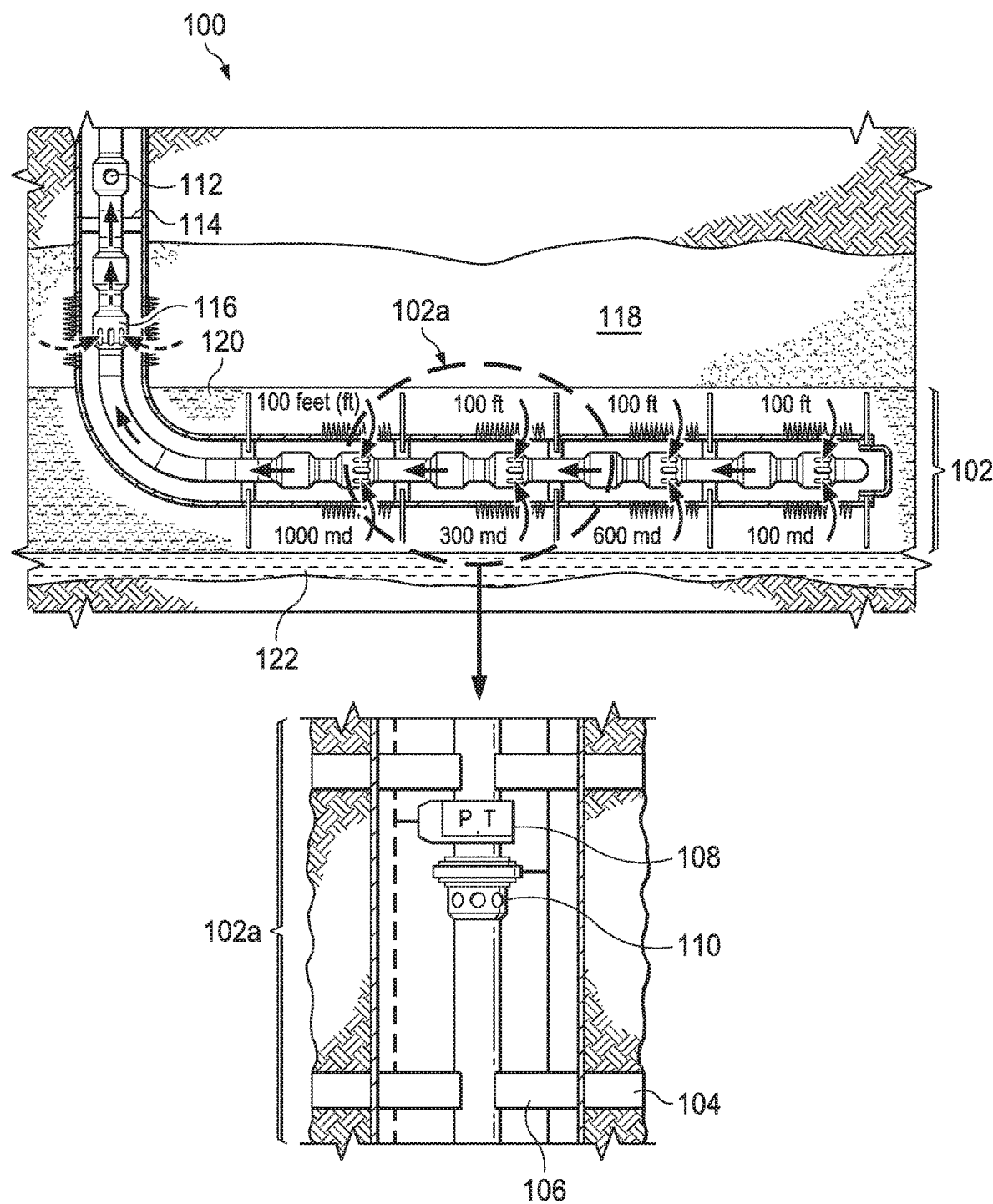
FIG. 1 is a diagram of an example of a multi-zonal smart well completion, according to some implementations of the present disclosure.

The following detailed description describes techniques for using real-time nodal analysis to automate production optimization in smart well completions. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

In general, smart (or intelligent) well completions (SWCs) are used to maximize multi-segmented (for example, multi-lateral) well productivity, restrict unwanted water and gas production, and improve sweep efficiency. To achieve the optimum economic values of smart completions, for example, surface and subsurface chock valves settings need to be frequently optimized using various techniques. Applying the right optimization technique can ensure, for example, a successful and efficient optimization. An increase in global utilization of the SWCs can increase the reliance on field optimization requirements of downhole inflow control valves (ICVs). Automated optimization techniques, for example, can eliminate the need for weeks of field-testing by providing a methodical approach to make ICV changes. Optimum (or optimal) settings can be defined, for example, as settings that maximize the production of a multi-segmented well over a period of time.

The present disclosure describes a production optimization approach using real-time data and nodal model for multi-segmented wells. In some implementations, optimization algorithms can be used to assist reservoir and production engineers in determining optimum production scenarios for complex wells, such as multi-segmented wells. For example, based on data from the current production conditions of a well, an algorithm can recommend changes to downhole valve settings that allow for optimized production.

Multi-segmented wells can be equipped with surface and subsurface downhole valves to provide real-time pressure and temperature data along. At the same time, a surface flow meter can measure multi-phase flow. Moreover, wells can contain ICV providing various choke settings to restrict flow based on the orifice size of each valve position. Optimization algorithms can use field data collected during a regular optimization approach and well control parameter (for example, ICV settings) regression, for example, using a commercial steady-state model. The optimization algorithms can estimate flowing parameters of individual segments, determine the optimum pressure drop across each downhole valve, and estimate productivity of each segment during commingled production at various choke valves settings. In some implementations, an optimum flow scenario can be determined using a genetic optimization algorithm that iteratively manipulates ICV valve settings using the calibrated model to provide maximum oil production and minimum water production.

The techniques of the present disclosure, including the optimization algorithms, were successfully field-tested in real time and validated, using generated models used to predict well performance at various conditions. The field testing started by collecting well rates and flowing bottomhole pressure data at various chokes settings for two flow conditions; commingled and individual segment testing. The acquired data was used to calibrate the model. After model calibration, an optimization algorithm was used to generate different production scenarios and optimize the performance of each segment.

FIG. 1 is a diagram of an example of a multi-zonal smart well completion 100, according to some implementations of the present disclosure. Each zone 102 (for example, a zone 102a) can be isolated with packers 104 and 106 and equipped with downhole pressure gauges 108 and a valve 110. As shown in FIG. 1, zones 102 are 100 feet (ft) long and have different permeabilities of 1000, 300, 600, and 100 millidarcies (md), for example. Each zone 102 can further contain a segment well. The packers 104 and 106 can include, for example, external swell packers, which are run with a screen, and internal swell packers, which run with completion. To achieve optimal economic values of the multi-zonal smart well completion 100, the surface and subsurface choke valves settings can be frequently optimized using various techniques. Applying the right optimization techniques can ensure a successful and efficient optimization.

The multi-zonal smart well completion 100 includes a safety valve 112, a production packer 114, and an ICV 116 that, as shown in FIG. 1, is located in a gas layer 118. The multi-zonal smart well completion 100 also includes an oil layer 120 (containing the zones 102) and a water layer 122. Other arrangements of layers are possible.

In some implementations, optimization algorithms (for example, for multi-segmented wells) can use artificial intelligence techniques such as a genetic algorithm (GA). Genetic algorithms include stochastic and heuristic search techniques based on the theory of natural selection and evolution to achieve a "survival of the fittest" solution. The use of such algorithms can lead to suggesting ICV settings in multi-segmented wells, which can then be used as input for a nodal model. In return, the result of the nodal model can be fed back into the algorithm to evaluate each solution presented by the algorithm.

In some implementations, the model may recommend only one set of settings for the ICVs in a multi-segmented well. Optimization algorithms (for example, genetic algorithms) can be implemented as stochastic methods to assure repeatability. The algorithms can be run multiple times, with the number of iterations used being sufficient for the size of the problem. For example, the number of iterations used can be based on learned patterns of correlating the number of iterations with a number of variables (for example, ICVs). The optimized solution can reflect the current state of the calibrated model and can be implemented immediately to begin realizing production gains. After a production interval has occurred in which well/reservoir conditions are expected (or likely) to change, the calibration and optimization of the model can be repeated to reflect these changes. In some implementations, automated processes can be used to apply the recommendations to the field, for example, as part of a closed-loop automated optimization. Models can be well-dependent, with each well having its own model modeling segments and well completion.

Figure 2:
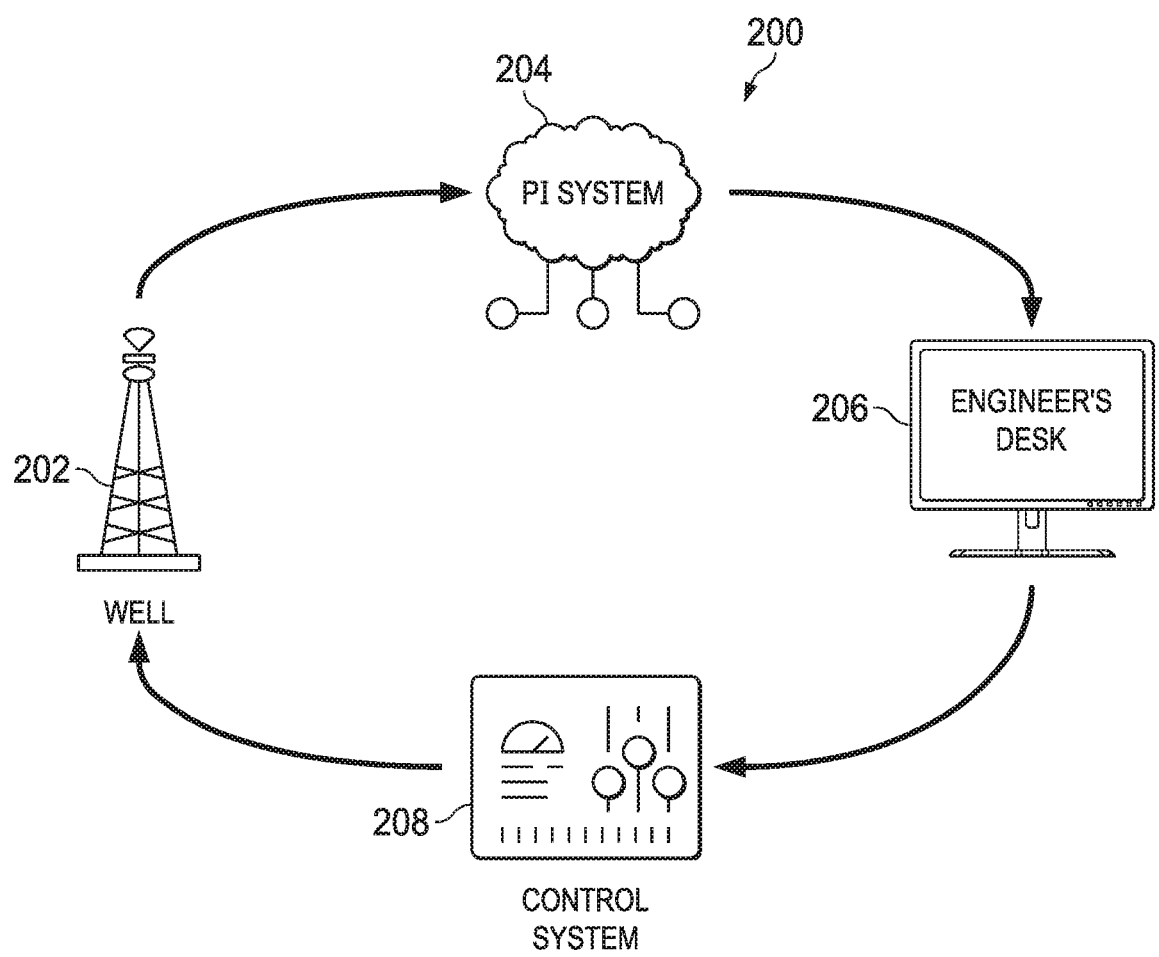
FIG. 2 is a block diagram showing an example of data flow paths in a smart well completion system using real-time nodal analysis, according to some implementations of the present disclosure.

FIG. 2 is a block diagram showing an example of data flow paths in a smart well completion system 200 using real-time nodal analysis, according to some implementations of the present disclosure. The smart well completion system 200 can be a multi-segmented well optimizing system, for example. The data flow paths can include a data flow originating from a well 202 and flowing through a productivity index (PI) system 204, and ultimately to a modeling and optimization station (for example, an engineer's desk 206). The data flow can continue to a control system 208 and back again to the well 202. The SWC system 200 can be used, for example, to automatically apply optimum ICV settings for a smart well completion. In some implementations, a SWC procedure using the SWC system 200 can include four main steps (or work flows) to achieve continuous real-time closed-loop optimization.

In a first main step of the SWC procedure, flow rate and pressure data can be received or retrieved from the well and collected into a central location. The flow rate and pressure data can be collected from wells that are equipped with surface and subsurface downhole valves and integrated in an integrated operations setup, for example, as shown in FIGS. 1 and 2.

In a second main step of the SWC procedure, a nodal analysis model can be constructed for initial use and subsequent update. In some implementations, initial model construction can follow the techniques described in U.S. patent application Ser. No. 16/414,535, filed on May 16, 2019, titled "Automated Production Optimization Technique for Smart Well Completions Using Real-Time Nodal Analysis," hereby incorporated in its entirety and summarized here. For example, during regular field optimization procedures, a multi-segmented well can be produced one segment at a time. Production and surface and downhole pressures can be recorded for these tests. The data can be used to calibrate a commercial steady-state model. The model can then be used to estimate flowing parameters of individual segments, determine the optimum pressure drop across each downhole valve, and estimate the productivity of each segment during the commingled production at various choke valves settings. Each segment's productivity index (PI) can be determined in real time and can be applied to the model to generate a commingled PI as defined by:

$$PI = \frac{Q}{P_{res} - P_{wf}} \quad (1)$$

where Q is the segment rate, $P_{res}$ is the reservoir pressure, and $P_{wf}$ is the well flowing bottomhole pressure.

After the model is in place, the user can define certain triggers that are selected to indicate one or more changes in flow conditions exceeding an absolute or relative threshold, such as a change in the flow rate, water cut, wellhead pressure, or downhole pressure. In some implementations, the thresholds can be specified in background code (before running the optimization). In some implementations, the triggers can be defined in a user interface such as the user interface presented in FIG. 3. The triggers can be defined by selecting preset thresholds or through user input fields that allow the user to input and modify the triggers at any time during the process. In some implementations, thresholds can be set and modified by the user using drop-down menus in a graphical user interface (GUI) with an options list (for example, for flow rate, water cut, wellhead pressure, and downhole pressure) from which the user can enter threshold values.

If the change exceeds a threshold defined by the engineer, the model can be recalibrated and optimization can be re-initiated. In some implementations, thresholds can be defined as absolute values or relative values (for example, percentages of change). In some implementations, the thresholds can be defined relative to a time period, such as an X % drop in pressure over a time period Y, or an absolute pressure change P over the time period Z.

In a third main step of the SWC procedure, optimization runs can be performed on the nodal model to find ICV settings that yield a greatest production (for example, oil production), a least water production rate, or combination of both. In some implementations, optimization algorithms (for example, for multi-segmented wells) can use artificial intelligence techniques such as a genetic algorithm (GA). Genetic algorithms include stochastic and heuristic search techniques based on the theory of natural selection and evolution to achieve a "survival of the fittest" solution. The use of such algorithms can lead to suggesting ICV settings in multi-segmented wells, which can then be used as input for a nodal model. In return, the result of the nodal model can be fed back into the algorithm to evaluate each solution presented by the algorithm.

Figure 3:
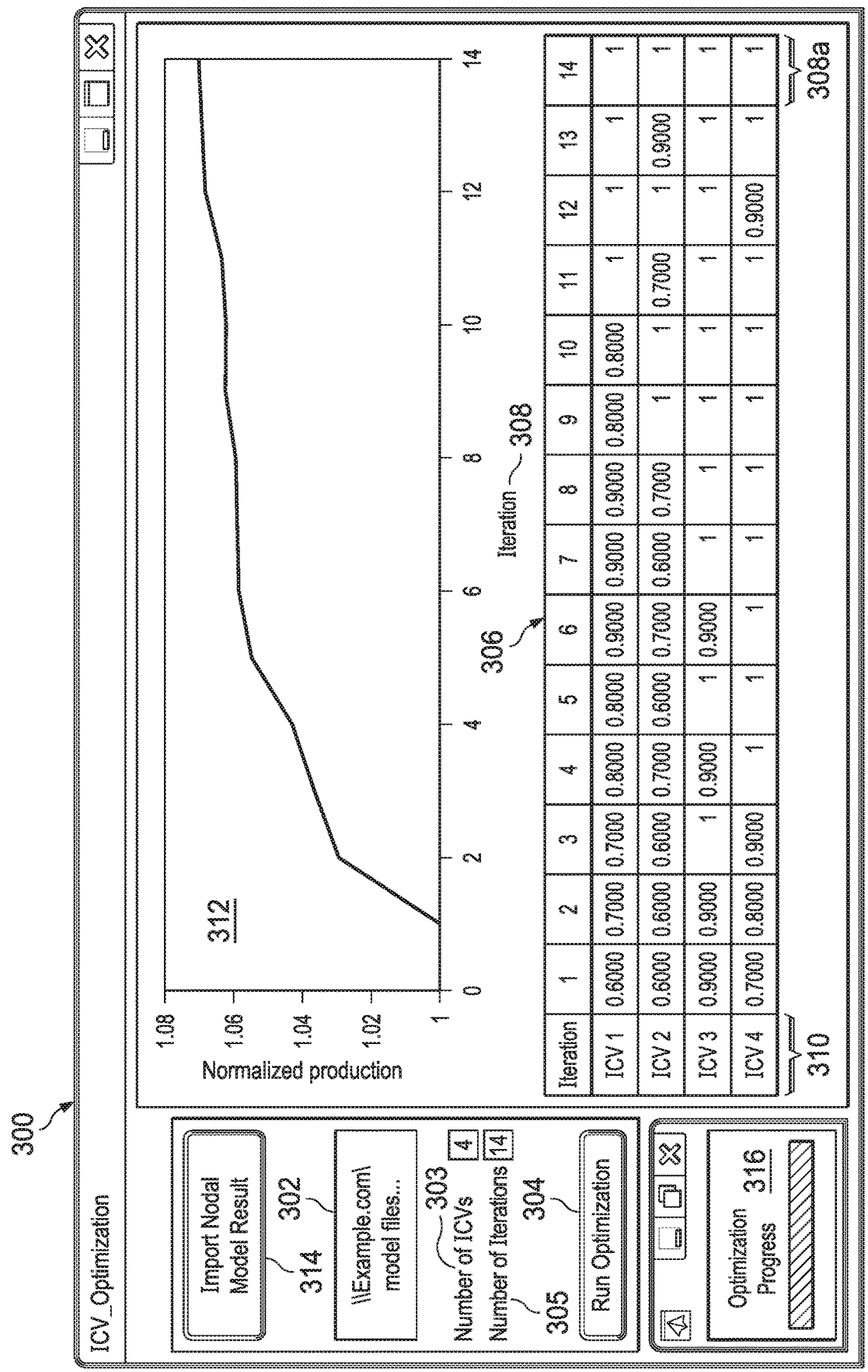
FIG. 3 is a screenshot of an example of an inflow control valve (ICV) optimization graphical user interface (GUI), according to some implementations of the present disclosure.
Figure 4:
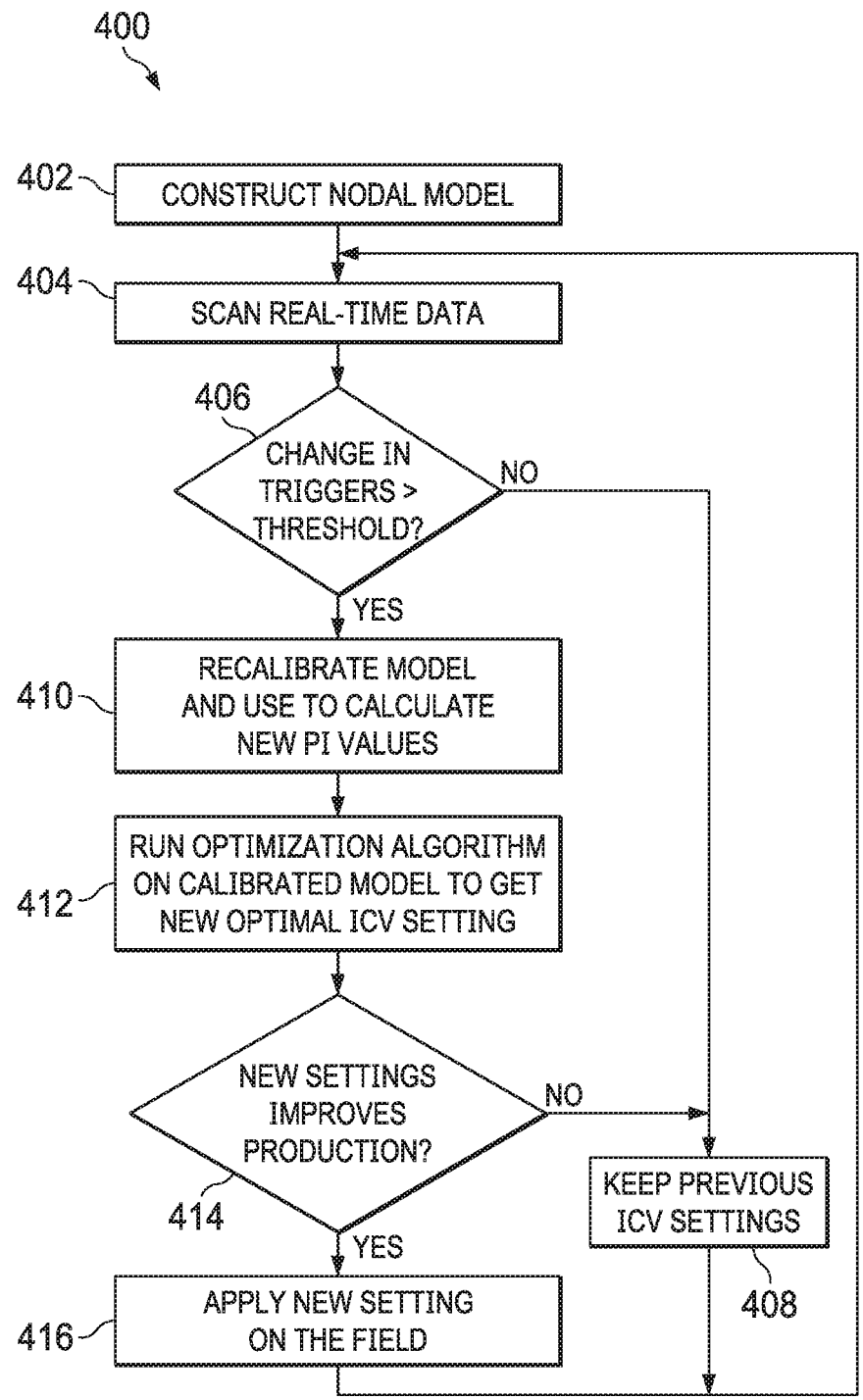
FIG. 4 is a flow diagram showing an example of an overall optimization workflow, according to some implementations of the present disclosure.

In some implementations, the optimization can be completed using an optimization loop, for example, as shown in FIG. 4 and summarized by the following steps. Control parameters are defined, and their feasible limits are identified. A diverse pool of possible initial solutions is created, where the pool honors parameter limits and covers the solution space. For example, engineers can use their previous oil industry experience in constructing the initial solutions. An objective function is defined (for example, based on a net present value and a total oil production). The objective function is evaluated for each solution, where the evaluation provides a reflection of the solution quality. Current solutions are ranked according to the value of the objective function. A check for convergence is performed. Convergence can be said to occur when, for example, no further change to the objective function occurs for three consecutive iterations. Genetic algorithm reproduction operators are applied to the current solutions. The steps can be repeated (including defining the objective function through applying the genetic algorithm) until the best-performing solution is identified after convergence is declared as the optimum solution In some implementations, the optimization algorithm can be formulated as a programming platform application (for example, matrix laboratory (MATLAB™)) GUI function. When executed, a front-end to the optimization algorithm can ask the user to specify a file location of the calibrated nodal analysis model file. Information can be extracted from the calibrated nodal analysis model file. The optimization can be run. Optimal output of the optimization can be provided in tabular format similar to what is shown in FIG. 3. Each column in the table represents one iteration in the optimization. The final column represents the optimum solution (for example, in this case the optimization recommends that all four ICVs should be fully open). The gain in production as predicted by the calibrated model is shown in the plot (for this case about 7% production gain as compared to the initial solution). This optimized solution reflects the current state of the calibrated model. If this state changes, another optimization can be performed on the new conditions as dictated by the triggers described earlier. The programming platform application can output an executable file that can be read by the control panel to automatically implement the ICV settings change.

As a fourth main step of the SWC procedure, the well engineer can receive the suggested optimal ICV settings and review them. For example, the optimal ICV settings can be displayed to the user in a user interface. If the user approves the suggested optimal ICV settings, the user can select an option or a control in the user interface to push the settings to a control panel for the well, where the suggested optimal ICV settings can be implemented in the well. The control panel can be either located in the well site or inside the gas-oil separation plant (GOSP) for i-field enabled fields. Once the optimal settings are received at the control panel from the software, the engineer can input the settings in the computer connected to the control panel. In this way, facilities that do not allow unmanned changes to the well settings (for example, due to security issues). In some implementations, optimization algorithms can be installed in the control panel computer, and changes can be implemented automatically as soon as the optimization is finished).

In some implementations, if an optimization algorithms is installed in a GOSP, a direct communication can exist between the program and the well. For example, the communication can be wired from the GOSP to a remote terminal unit (RTU) located near the well. A wired or wireless communication can exist from the RTU to the ICV panel on the well. This type of open communication channel can allow for a closed loop optimization in real-time. In some implementations, testing of the optimization algorithms can be implemented with the optimization program pushing the results to a reservoir simulation model, which can emulates the well performance.

FIG. 3 is a screenshot of an example of an ICV optimization graphical user interface (GUI) 300, according to some implementations of the present disclosure. In some implementations, the ICV optimization GUI 300 can be used with optimization algorithms. The ICV optimization GUI 300 can be formulated or implemented as a programming platform application GUI and function. When executed, the GUI can ask the user to specify a location 302 of a calibrated nodal analysis model file to be used by the model. The function can extract the needed information, execute the optimization (for example, when a control 304 is selected), and provide the optimal output in tabular format in a table 306 for presentation in the GUI. Each column in the table 306 represents a single iteration 308 in the optimization. A final column 308a can represent an optimum solution. In this example, the optimization can recommend that all four ICVs 310 (for example, corresponding to segments) should be fully open, as indicated as an opening fraction (where 1.0=fully open). The gain in production, as predicted by the calibrated model, is shown in a plot 312 (for example, indicating an approximate 7% production gain as compared to the initial solution). In some implementations, a control 314 can be used to import a nodal model result. A control 316 can be used to initiate a display of a progress bar indicating a completion progress of the optimization.

In some implementations, the GUI 300 can be designed and created, for example, using a user interface (UI) design package or a programming platform application, such as MATLAB™. For example, a UI design package can provide a GUI that allows a user to place figures, tables, and buttons (for example, to design the GUI 300) and edit text and properties associated with elements in the UI. Each clickable button in the UI can be linked to its corresponding code.

When the GUI 300 is initially displayed (for example, before an optimization is run), the plot 312 and the table 306 are empty. The user's first action can be to click on the control 314 (for example, an "Import Nodal Model Results" button). In this example, it is assumed that a nodal analysis model has already been run and the output has already been saved in a format that is compatible with the UI. For example, the output that has been saved from the analysis includes the ICV settings and their relationships to flow rates from each segment.

After the user clicks on the control 314, the system can display a popup that the user can use to locate the file containing the ICV settings versus the segment flow rate data. The popup can include controls for browsing a hierarchical file structure, for example, to locate the file.

After the file is selected, the user can use a "Number of ICVs" control 303 to enter a number of ICVs in the well (for example, four). The user can also use a "Number of Iterations" control 305 to enter a number of iterations for which an optimization is to be run. User selection of fewer iterations will produce quicker results. If processing time is not a concern for the user, then the number of iterations can be increased. Optimizations can be stopped if no further improvement on the solution is observed, for example, between successive runs.

After the number of ICVs and iterations have been entered, the user can click on the "Run Optimization" button (control 304). This triggers the beginning of the optimization. The optimization progression (control 316) becomes active. At this time, the table 306 can be updated (and rows labeled) to reflect the number of ICVs (for example, four) selected by the user.

The plot 312, table 306, and optimization progress bar can be updated after each iteration, including adding another column to the table 306 for each iteration. The first iteration can represent the best solution from the input file, which may be only a subset of all possible solutions, as the nodal analysis model only considers a few possible ICV settings for each segment. Subsequent iterations can apply the genetic algorithm to improve on the optimal solution from each previous iteration.

The plot 312 shown in FIG. 3 indicates the results after the optimization has completed. In this example, the optimal solution provides approximately a 7% production increase over the base case after 14 iterations. Also, the optimal solution reached by the algorithm indicates that all four ICVs are to be kept fully open (as defined by a setting of 1, indicating 100% open).

FIG. 4 is a flow diagram showing an example of an overall optimization workflow 400, according to some implementations of the present disclosure. The workflow 400 includes a continuous automated optimization procedure. The procedure can start with data collection and end by applying the model solution to the field. The workflow includes steps techniques for SWC optimization to i-fields and data collection described in U.S. patent application Ser. No. 16/414, 535, filed on May 16, 2019, titled "Automated Production Optimization Technique for Smart Well Completions Using Real-Time Nodal Analysis," as previously introduced.

At 402, a nodal model is constructed, for example, based on techniques U.S. patent application Ser. No. 16/414,535. At 404, real-time data is scanned, for example, using information received or retrieved from an oil production facility. For example, a developed programming platform application algorithm can include a module for data parsing into a vector (for example, representing a parameter as a function of time) or a matrix (for example, if several parameters exist). In some implementations, when the algorithm is run for a specific time interval (for example, with a data location specified), the parameters associated with the time interval can be imported into the programming platform application space to initiate the optimization. Production fields and developments can include an i-Field platform, where the well data (including, for example, pressure, temperature, and flow rate) can be displayed in real time through the PI system. In some implementations, Excel, programming platform application, or a structured query language (SQL) server can be used to query the PI database and download a section of the data for a specific well or a group of wells for a defined time period. Once the data is downloaded, the data can be imported into the optimization software.

At 406, a determination is made whether a change in triggers exceeds a threshold defined, for example, by the engineer or by an automated system or process. If not, then the previous ICV settings are kept at 408, and the workflow 400 returns to step 404. When the determination indicated that the change in the triggers exceeds the threshold, then the model is recalibrated and used to calculate new PI values at 410. At 412, the optimization algorithm is run on the calibrated model to determine new optimal ICV control settings.

At 414, a determination is made whether the new settings improve production. In some implementations, the determination can be made using a simple comparison with the flow rate from the previous ICV settings. For example, if the new oil rate is greater than the old oil rate, then a production improvement is indicated. In other words, the production improvement can be the difference between the production with the new settings minus the production with the old settings (with a positive value indicating production improvement). In some implementations, other criteria can be specified by the user, such as criteria associated with reduced water production, production profile equalization (for example, equal production from the different ICVs), or maintaining a drawdown (bottomhole pressure minus reservoir pressure) within a user-specified range. These types of criteria can be implemented within application code (for example, within a backend), or implemented using GUI drop-down menus, or as a combination.

If not, then the workflow returns to step 408, keeping the previous ICV settings. If the new settings are determined to improved production, then the new settings are applied to the field at 416. Then the workflow 400 can resume at step 404, where real-time data is scanned, this time using the applied new settings.

In some implementations, various well production conditions can exist that improve the results of optimization. For example, better results can be achieved when healthy surface and subsurface equipment exists, such as ICVs, permanent downhole monitors (PDHMs), and multi-phase flow meter (MPFM) that give accurate measurement of well rate and downhole pressure.

Smart well components, such as rate, downhole pressure gauges and ICVs, need to be regularly maintained, inspected and operative to carry-out the described invention and gain desired benefits of the invented approach.

Figure 5:
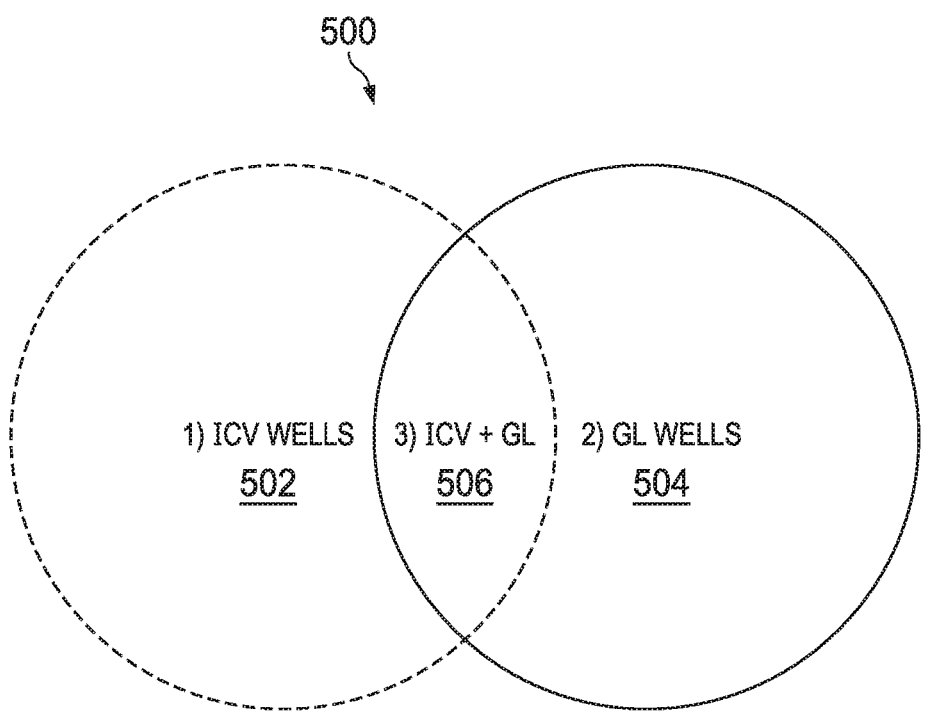
FIG. 5 is a set diagram showing an example of an intersection of different well types, according to some implementations of the present disclosure.

FIG. 5 is a set diagram showing an example of an intersection 500 of different well types, according to some implementations of the present disclosure. The different well types include ICV wells 502 and gas lift (GL) wells 504. Wells 506 include aspects of ICV wells 502 and GL wells 504.

Systems for ICV wells 502 and GL wells 504 are independent, but the wells can co-exist. For example, well productivity can be enhanced using different aspects, for example, GL to help lift downhole fluid when there is not enough pressure support, and ICVs to provide more reservoir control to maximize oil and minimize water production.

The techniques described in the present disclosure can be used in ICV wells, but not in GL wells, where only some types of methods, for example, can be used. In common areas (for example, wells 506 that include aspects of ICV wells 502 and GL wells 504), the techniques described in the present disclosure can be used. For example, the workflow 400 can be used to optimize production from ICVs, and Querales method can be used to optimize GL system performance, or both techniques can be used simultaneously to improve performance of their respective system.

Figure 6:
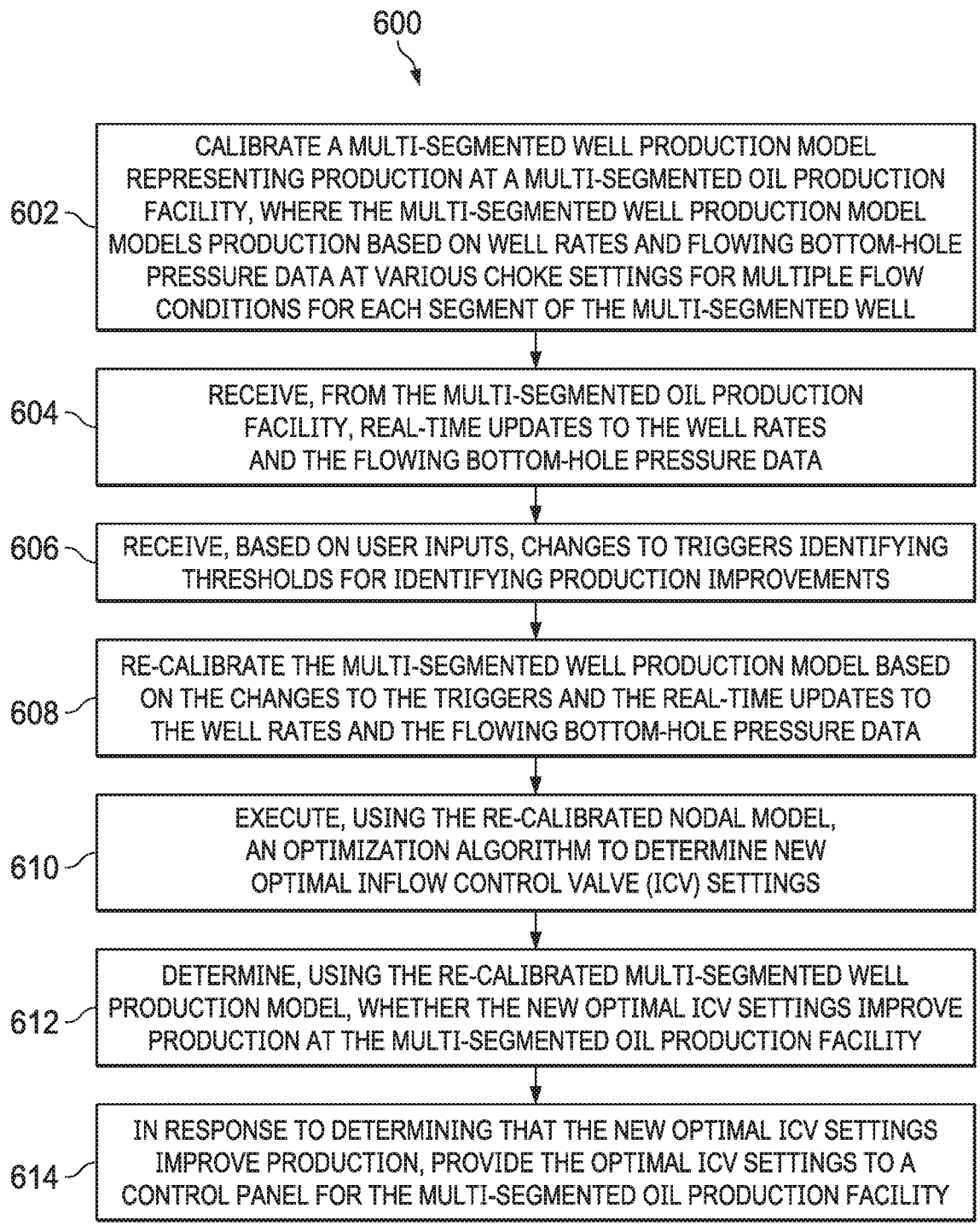
FIG. 6 is a flowchart of an example method for determining new optimal ICV settings for improving production at a multi-segmented oil production facility and providing the optimal ICV settings to a control panel for the multi-segmented oil production facility, according to some implementations of the present disclosure.

FIG. 6 is a flowchart of an example method 600 for determining new optimal ICV settings for improving production at a multi-segmented oil production facility and providing the optimal ICV settings to a control panel for the multi-segmented oil production facility, according to some implementations of the present disclosure. For clarity of presentation, the description that follows generally describes method 600 in the context of the other figures in this description. However, it will be understood that method 600 can be performed, for example, by any suitable system, environment, software, and hardware, or a combination of systems, environments, software, and hardware, as appropriate. In some implementations, various steps of method 600 can be run in parallel, in combination, in loops, or in any order.

At 602, a multi-segmented well production model representing production at a multi-segmented oil production facility is calibrated. The multi-segmented well production model models production based on well rates and flowing bottom-hole pressure data at various choke settings for multiple flow conditions for each segment of the multi-segmented well. As an example, the model described with reference to FIG. 1 can be calibrated. The multiple flow conditions for which the model is set up can include commingled testing and individual segment testing, for example. From 602, method 600 proceeds to 604.

At 604, real-time updates to the well rates and the flowing bottom-hole pressure data are received from the multi-segmented oil production facility. For example, real-time information can be received by the PI system 204 from the well 202. From 604, method 600 proceeds to 606.

At 606, changes to triggers identifying thresholds for identifying production improvements are received based on user inputs. As an example, the user can use the GUI 300 or UIs accessible through the GUI 300 to input numerical thresholds that are to be used for settings thresholds. From 606, method 600 proceeds to 608.

At 608, the multi-segmented well production model is re-calibrated based on the changes to the triggers and the real-time updates to the well rates and the flowing bottom-hole pressure data. For example, real-time information from the well 200 can be used to calibrate the model. From 608, method 600 proceeds to 610.

At 610, using the re-calibrated nodal model, an optimization algorithm is executed to determine new optimal inflow control valve (ICV) settings. For example, the optimization algorithm can identify settings to maximize multi-segmented well productivity, restrict unwanted water and gas production in the multi-segmented well, and improve sweep efficiency for the multi-segmented well. From 610, method 600 proceeds to 612.

At 612, using the re-calibrated multi-segmented well production model, a determination is made whether the new optimal ICV settings improve production at the multi-segmented oil production facility. As an example, the system can determine whether the new optimal ICV settings improve one or more of multi-segmented well productivity, restricted unwanted water and gas production, and sweep efficiency. The determination can include determining if the improvement is greater than a pre-determined threshold, for example, an absolute value or a relative value (for example, a predetermined percentage). From 612, method 600 proceeds to 614.

At 614, in response to determining that the new optimal ICV settings improve production, the optimal ICV settings are provided to a control panel for the multi-segmented oil production facility. For example, using a UI such as the GUI 300, the user can make a selection on a screen to send the optimal ICV settings to a control panel, where the optimal ICV settings can be selected for real-time implementation.

In some implementations, providing the optimal ICV settings to the control panel for the multi-segmented oil production facility includes sending, by a multi-segmented well optimizing system, control commands to the control panel. The control commands can include, for example, commands to change settings for surface ICVs and subsurface ICVs in one or more segments of the multi-segmented well, and choke settings commands to set different choke settings on different ICVs. After 614, method 600 can stop.

In some implementations, providing the optimal ICV settings to the control panel includes providing an executable file output by a programming platform application program. In this example, method 600 can further include executing, by the control panel, the executable file to automatically implement the optimal ICV settings.

Figure 7:
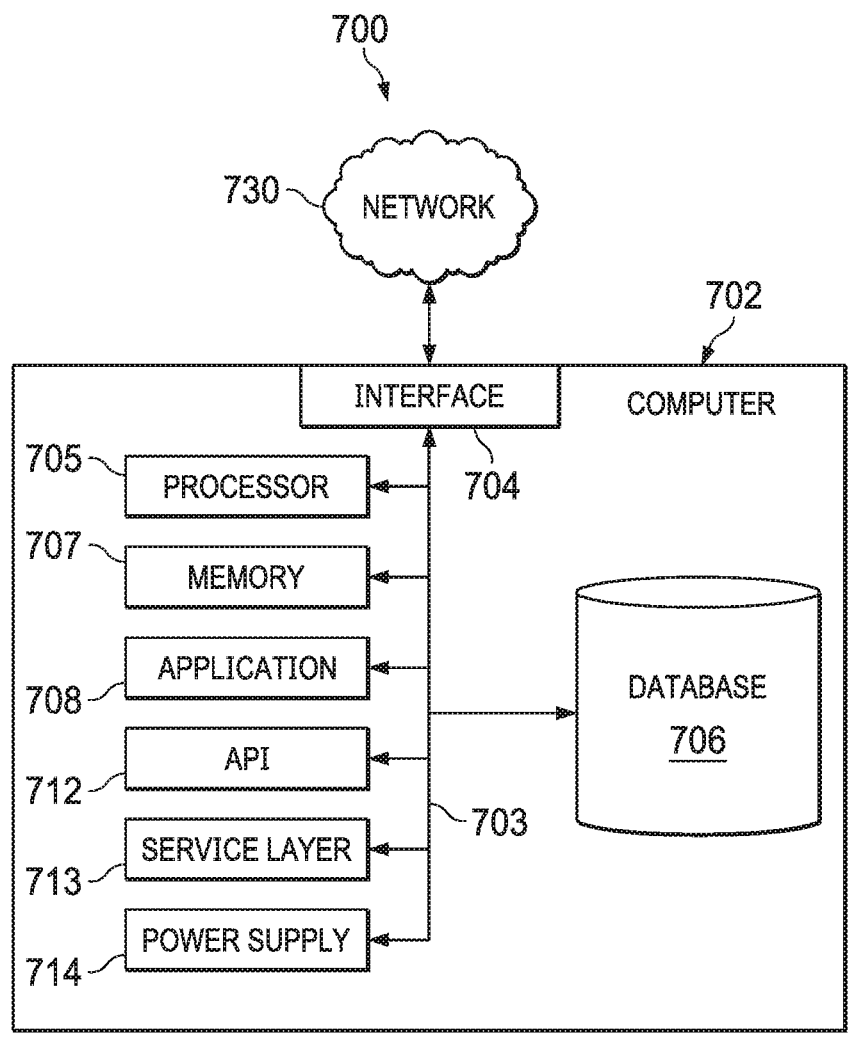
FIG. 7 is a block diagram illustrating an example computer system used to provide computational functionalities associated with described algorithms, methods, functions, processes, flows, and procedures as described in the present disclosure, according to some implementations of the present disclosure.

FIG. 7 is a block diagram of an example computer system 700 used to provide computational functionalities associated with described algorithms, methods, functions, processes, flows, and procedures described in the present disclosure, according to some implementations of the present disclosure. The illustrated computer 702 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 702 can include input devices such as keypads, keyboards, and touch screens that can accept user information. Also, the computer 702 can include output devices that can convey information associated with the operation of the computer 702. The information can include digital data, visual data, audio information, or a combination of information. The information can be presented in a graphical user interface (UI) (or GUI).

The computer 702 can serve in a role as a client, a network component, a server, a database, a persistency, or components of a computer system for performing the subject matter described in the present disclosure. The illustrated computer 702 is communicably coupled with a network 730. In some implementations, one or more components of the computer 702 can be configured to operate within different environments, including cloud-computing-based environments, local environments, global environments, and combinations of environments.

At a top level, the computer 702 is an electronic computing device operable to receive, transmit, process, store, and manage data and information associated with the described subject matter. According to some implementations, the computer 702 can also include, or be communicably coupled with, an application server, an email server, a web server, a caching server, a streaming data server, or a combination of servers.

The computer 702 can receive requests over network 730 from a client application (for example, executing on another computer 702). The computer 702 can respond to the received requests by processing the received requests using software applications. Requests can also be sent to the computer 702 from internal users (for example, from a command console), external (or third) parties, automated applications, entities, individuals, systems, and computers.

Each of the components of the computer 702 can communicate using a system bus 703. In some implementations, any or all of the components of the computer 702, including hardware or software components, can interface with each other or the interface 704 (or a combination of both) over the system bus 703. Interfaces can use an application programming interface (API) 712, a service layer 713, or a combination of the API 712 and service layer 713. The API 712 can include specifications for routines, data structures, and object classes. The API 712 can be either computer-language independent or dependent. The API 712 can refer to a complete interface, a single function, or a set of APIs.

The service layer 713 can provide software services to the computer 702 and other components (whether illustrated or not) that are communicably coupled to the computer 702. The functionality of the computer 702 can be accessible for all service consumers using this service layer. Software services, such as those provided by the service layer 713, can provide reusable, defined functionalities through a defined interface. For example, the interface can be software written in JAVA, C++, or a language providing data in extensible markup language (XML) format. While illustrated as an integrated component of the computer 702, in alternative implementations, the API 712 or the service layer 713 can be stand-alone components in relation to other components of the computer 702 and other components communicably coupled to the computer 702. Moreover, any or all parts of the API 712 or the service layer 713 can be implemented as child or sub-modules of another software module, enterprise application, or hardware module without departing from the scope of the present disclosure.

The computer 702 includes an interface 704. Although illustrated as a single interface 704 in FIG. 7, two or more interfaces 704 can be used according to particular needs, desires, or particular implementations of the computer 702 and the described functionality. The interface 704 can be used by the computer 702 for communicating with other systems that are connected to the network 730 (whether illustrated or not) in a distributed environment. Generally, the interface 704 can include, or be implemented using, logic encoded in software or hardware (or a combination of software and hardware) operable to communicate with the network 730. More specifically, the interface 704 can include software supporting one or more communication protocols associated with communications. As such, the network 730 or the interface's hardware can be operable to communicate physical signals within and outside of the illustrated computer 702.

The computer 702 includes a processor 705. Although illustrated as a single processor 705 in FIG. 7, two or more processors 705 can be used according to particular needs, desires, or particular implementations of the computer 702 and the described functionality. Generally, the processor 705 can execute instructions and can manipulate data to perform the operations of the computer 702, including operations using algorithms, methods, functions, processes, flows, and procedures as described in the present disclosure.

The computer 702 also includes a database 706 that can hold data for the computer 702 and other components connected to the network 730 (whether illustrated or not). For example, database 706 can be an in-memory, conventional, or a database storing data consistent with the present disclosure. In some implementations, database 706 can be a combination of two or more different database types (for example, hybrid in-memory and conventional databases) according to particular needs, desires, or particular implementations of the computer 702 and the described functionality. Although illustrated as a single database 706 in FIG. 7, two or more databases (of the same, different, or combination of types) can be used according to particular needs, desires, or particular implementations of the computer 702 and the described functionality. While database 706 is illustrated as an internal component of the computer 702, in alternative implementations, database 706 can be external to the computer 702.

The computer 702 also includes a memory 707 that can hold data for the computer 702 or a combination of components connected to the network 730 (whether illustrated or not). Memory 707 can store any data consistent with the present disclosure. In some implementations, memory 707 can be a combination of two or more different types of memory (for example, a combination of semiconductor and magnetic storage) according to particular needs, desires, or particular implementations of the computer 702 and the described functionality. Although illustrated as a single memory 707 in FIG. 7, two or more memories 707 (of the same, different, or combination of types) can be used according to particular needs, desires, or particular implementations of the computer 702 and the described functionality. While memory 707 is illustrated as an internal component of the computer 702, in alternative implementations, memory 707 can be external to the computer 702.

The application 708 can be an algorithmic software engine providing functionality according to particular needs, desires, or particular implementations of the computer 702 and the described functionality. For example, application 708 can serve as one or more components, modules, or applications. Further, although illustrated as a single application 708, the application 708 can be implemented as multiple applications 708 on the computer 702. In addition, although illustrated as internal to the computer 702, in alternative implementations, the application 708 can be external to the computer 702.

The computer 702 can also include a power supply 714. The power supply 714 can include a rechargeable or non-rechargeable battery that can be configured to be either user- or non-user-replaceable. In some implementations, the power supply 714 can include power-conversion and management circuits, including recharging, standby, and power management functionalities. In some implementations, the power-supply 714 can include a power plug to allow the computer 702 to be plugged into a wall socket or a power source to, for example, power the computer 702 or recharge a rechargeable battery.

There can be any number of computers 702 associated with, or external to, a computer system containing computer 702, with each computer 702 communicating over network 730. Further, the terms "client," "user," and other appropriate terminology can be used interchangeably, as appropriate, without departing from the scope of the present disclosure. Moreover, the present disclosure contemplates that many users can use one computer 702 and one user can use multiple computers 702.

Described implementations of the subject matter can include one or more features, alone or in combination.

For example, in a first implementation, a computer-implemented method, including the following. A multi-segmented well production model representing production at a multi-segmented oil production facility is calibrated. The multi-segmented well production model models production based on well rates and flowing bottom-hole pressure data at various choke settings for multiple flow conditions for each segment of the multi-segmented well. Real-time updates to the well rates and the flowing bottom-hole pressure data are received from the multi-segmented oil production facility. Changes to triggers identifying thresh-olds for identifying production improvements are received based on user inputs. The multi-segmented well production model is re-calibrated based on the changes to the triggers and the real-time updates to the well rates and the flowing bottom-hole pressure data. Using the re-calibrated nodal model, an optimization algorithm is executed to determine new optimal inflow control valve (ICV) settings. Using the re-calibrated multi-segmented well production model, a determination is made whether the new optimal ICV settings improve production at the multi-segmented oil production facility. In response to determining that the new optimal ICV settings improve production, the optimal ICV settings are provided to a control panel for the multi-segmented oil production facility.

The foregoing and other described implementations can each, optionally, include one or more of the following features:

A first feature, combinable with any of the following features, where the multiple flow conditions include commingled testing and individual segment testing.

A second feature, combinable with any of the previous or following features, where the optimization algorithm maximizes multi-segmented well productivity, restricts unwanted water and gas production in the multi-segmented well, and improves sweep efficiency for the multi-segmented well.

A third feature, combinable with any of the previous or following features, where providing the optimal ICV settings to the control panel for the multi-segmented oil production facility includes sending, by a multi-segmented well optimizing system, control commands to the control panel.

A fourth feature, combinable with any of the previous or following features, where the control commands include commands to change settings for surface ICVs and subsurface ICVs in one or more segments of the multi-segmented well.

A fifth feature, combinable with any of the previous or following features, where the control commands include choke settings commands to set different choke settings on different ICVs.

A sixth feature, combinable with any of the previous or following features, where providing the optimal ICV settings to the control panel includes providing an executable file output by a programming platform application, and where the computer-implemented method further includes executing, by the control panel, the executable file to automatically implement the optimal ICV settings.

In a second implementation, a non-transitory, computer-readable medium storing one or more instructions executable by a computer system to perform operations including the following. A multi-segmented well production model representing production at a multi-segmented oil production facility is calibrated. The multi-segmented well production model models production based on well rates and flowing bottom-hole pressure data at various choke settings for multiple flow conditions for each segment of the multi-segmented well. Real-time updates to the well rates and the flowing bottom-hole pressure data are received from the multi-segmented oil production facility. Changes to triggers identifying thresholds for identifying production improvements are received based on user inputs. The multi-segmented well production model is re-calibrated based on the changes to the triggers and the real-time updates to the well rates and the flowing bottom-hole pressure data. Using the re-calibrated nodal model, an optimization algorithm is executed to determine new optimal inflow control valve (ICV) settings. Using the re-calibrated multi-segmented well production model, a determination is made whether the new optimal ICV settings improve production at the multi-segmented oil production facility. In response to determining that the new optimal ICV settings improve production, the optimal ICV settings are provided to a control panel for the multi-segmented oil production facility.

The foregoing and other described implementations can each, optionally, include one or more of the following features:

A first feature, combinable with any of the following features, where the multiple flow conditions include commingled testing and individual segment testing.

A second feature, combinable with any of the previous or following features, where the optimization algorithm maximizes multi-segmented well productivity, restricts unwanted water and gas production in the multi-segmented well, and improves sweep efficiency for the multi-segmented well.

A third feature, combinable with any of the previous or following features, where providing the optimal ICV settings to the control panel for the multi-segmented oil production facility includes sending, by a multi-segmented well optimizing system, control commands to the control panel.

A fourth feature, combinable with any of the previous or following features, where the control commands include commands to change settings for surface ICVs and subsurface ICVs in one or more segments of the multi-segmented well.

A fifth feature, combinable with any of the previous or following features, where the control commands include choke settings commands to set different choke settings on different ICVs.

A sixth feature, combinable with any of the previous or following features, where providing the optimal ICV settings to the control panel includes providing an executable file output by a programming platform application, and where the operations further include executing, by the control panel, the executable file to automatically implement the optimal ICV settings.

In a third implementation, a computer-implemented system, including one or more processors and a non-transitory computer-readable storage medium coupled to the one or more processors and storing programming instructions for execution by the one or more processors, the programming instructions instructing the one or more processors to perform operations including the following. A multi-segmented well production model representing production at a multi-segmented oil production facility is calibrated. The multi-segmented well production model models production based on well rates and flowing bottom-hole pressure data at various choke settings for multiple flow conditions for each segment of the multi-segmented well. Real-time updates to the well rates and the flowing bottom-hole pressure data are received from the multi-segmented oil production facility. Changes to triggers identifying thresholds for identifying production improvements are received based on user inputs. The multi-segmented well production model is re-calibrated based on the changes to the triggers and the real-time updates to the well rates and the flowing bottom-hole pressure data. Using the re-calibrated nodal model, an optimization algorithm is executed to determine new optimal inflow control valve (ICV) settings. Using the re-calibrated multi-segmented well production model, a determination is made whether the new optimal ICV settings improve production at the multi-segmented oil production facility. In response to determining that the new optimal ICV settings improve production, the optimal ICV settings are provided to a control panel for the multi-segmented oil production facility.

The foregoing and other described implementations can each, optionally, include one or more of the following features:

A first feature, combinable with any of the following features, where the multiple flow conditions include commingled testing and individual segment testing.

A second feature, combinable with any of the previous or following features, where the optimization algorithm maximizes multi-segmented well productivity, restricts unwanted water and gas production in the multi-segmented well, and improves sweep efficiency for the multi-segmented well.

A third feature, combinable with any of the previous or following features, where providing the optimal ICV settings to the control panel for the multi-segmented oil production facility includes sending, by a multi-segmented well optimizing system, control commands to the control panel.

A fourth feature, combinable with any of the previous or following features, where the control commands include commands to change settings for surface ICVs and subsurface ICVs in one or more segments of the multi-segmented well.

A fifth feature, combinable with any of the previous or following features, where the control commands include choke settings commands to set different choke settings on different ICVs.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/-R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a device for a user or client in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method, comprising:
    calibrating, by a well production control system, a multi-segmented well production model representing production at a multi-segmented oil production facility, wherein the multi-segmented well production model models production based on well rates and flowing bottom-hole pressure data at various choke settings for multiple flow conditions for each segment of a multi-segmented well;
    receiving, by the well production control system from the multi-segmented oil production facility, real-time updates to the well rates and the flowing bottom-hole pressure data;
    receiving, by the well production control system, user inputs defining triggers for identifying thresholds for determining that production improvements have occurred, wherein the thresholds include one or both of a relative threshold defining a relative change in pressure over a first time period and an absolute threshold defining an absolute change in pressure over a second time period;
    determining, by the well production control system using the defined triggers, that changes in production improvements exceeding the thresholds have occurred;
    determining, by the well production control system, that a production interval has occurred;
    re-calibrating, by the well production control system using the real-time updates to the well rates and the flowing bottom-hole pressure data, the multi-segmented well production model;
    iterating, using a number of iterations based on learned patterns of correlating the number of iterations with a number of variables, executions of an optimization algorithm of the multi-segmented well production model, including:
        executing, by the well production control system using the re-calibrated multi-segmented well production model, the optimization algorithm to determine new optimal inflow control valve (ICV) settings;
        comparing, by the well production control system, a flow rate determined from the new optimal ICV settings with a flow rate using previous ICV settings; and
        determining, by the well production control system based on the comparing and the re-calibrated multi-segmented well production model, that the new optimal ICV settings result in an improvement of production at the multi-segmented oil production facility, the improvement being at least a pre-determined percentage above a production rate using previous ICV settings; and
    providing, by the well production control system, the optimal ICV settings to a control panel for the multi-segmented oil production facility.

2. The computer-implemented method of claim 1, wherein the multiple flow conditions include commingled testing and individual segment testing.

3. The computer-implemented method of claim 1, wherein the optimization algorithm maximizes multi-segmented well productivity, restricts unwanted water and gas production in the multi-segmented well, and improves sweep efficiency for the multi-segmented well.

4. The computer-implemented method of claim 1, wherein providing the optimal ICV settings to the control panel for the multi-segmented oil production facility includes sending, by a multi-segmented well optimizing system, control commands to the control panel.

5. The computer-implemented method of claim 4, wherein the control commands include commands to change settings for surface ICVs and subsurface ICVs in one or more segments of the multi-segmented well.

6. The computer-implemented method of claim 5, wherein the control commands include choke settings commands to set different choke settings on different ICVs.

7. The computer-implemented method of claim 1, wherein providing the optimal ICV settings to the control panel includes providing an executable file output by a programming platform application, and wherein the computer-implemented method further comprises executing, by the control panel, the executable file to automatically implement the optimal ICV settings.

8. A non-transitory, computer-readable medium storing one or more instructions executable by a computer system to perform operations comprising:
    calibrating, by a well production control system, a multi-segmented well production model representing production at a multi-segmented oil production facility, wherein the multi-segmented well production model models production based on well rates and flowing bottom-hole pressure data at various choke settings for multiple flow conditions for each segment of a multi-segmented well;
    receiving, by the well production control system from the multi-segmented oil production facility, real-time updates to the well rates and the flowing bottom-hole pressure data;
    receiving, by the well production control system, user inputs defining triggers for identifying thresholds for determining that production improvements have occurred, wherein the thresholds include one or both of a relative threshold defining a relative change in pressure over a first time period and an absolute threshold defining an absolute change in pressure over a second time period;
    determining, by the well production control system using the defined triggers, that changes in production improvements exceeding the thresholds have occurred;
    determining, by the well production control system, that a production interval has occurred;
    re-calibrating, by the well production control system using the real-time updates to the well rates and the flowing bottom-hole pressure data, the multi-segmented well production model;
    iterating, using a number of iterations based on learned patterns of correlating the number of iterations with a number of variables, executions of an optimization algorithm of the multi-segmented well production model, including:
        executing, by the well production control system using the re-calibrated multi-segmented well production model, the optimization algorithm to determine new optimal inflow control valve (ICV) settings;
        comparing, by the well production control system, a flow rate determined from the new optimal ICV settings with a flow rate using previous ICV settings; and
        determining, by the well production control system based on the comparing and the re-calibrated multi-segmented well production model, that the new optimal ICV settings result in an improvement of production at the multi-segmented oil production facility, the improvement being at least a pre-determined percentage above a production rate using previous ICV settings; and
    providing, by the well production control system, the optimal ICV settings to a control panel for the multi-segmented oil production facility.

9. The non-transitory, computer-readable medium of claim 8, wherein the multiple flow conditions include commingled testing and individual segment testing.

10. The non-transitory, computer-readable medium of claim 8, wherein the optimization algorithm maximizes multi-segmented well productivity, restricts unwanted water and gas production in the multi-segmented well, and improves sweep efficiency for the multi-segmented well.

11. The non-transitory, computer-readable medium of claim 8, wherein providing the optimal ICV settings to the control panel for the multi-segmented oil production facility includes sending, by a multi-segmented well optimizing system, control commands to the control panel.

12. The non-transitory, computer-readable medium of claim 11, wherein the control commands include commands to change settings for surface ICVs and subsurface ICVs in one or more segments of the multi-segmented well.

13. The non-transitory, computer-readable medium of claim 12, wherein the control commands include choke settings commands to set different choke settings on different ICVs.

14. The non-transitory, computer-readable medium of claim 8, wherein providing the optimal ICV settings to the control panel includes providing an executable file output by a programming platform application, and wherein the operations further comprise executing, by the control panel, the executable file to automatically implement the optimal ICV settings.

15. A computer-implemented system, comprising:
    one or more processors; and
    a non-transitory computer-readable storage medium coupled to the one or more processors and storing programming instructions for execution by the one or more processors, the programming instructions instructing the one or more processors to perform operations comprising:
        calibrating, by a well production control system, a multi-segmented well production model representing production at a multi-segmented oil production facility, wherein the multi-segmented well production model models production based on well rates and flowing bottom-hole pressure data at various choke settings for multiple flow conditions for each segment of a multi-segmented well;
        receiving, by the well production control system from the multi-segmented oil production facility, real-time updates to the well rates and the flowing bottom-hole pressure data;
        receiving, by the well production control system, user inputs to defining triggers for identifying thresholds for determining that production improvements have occurred, wherein the thresholds include one or both of a relative threshold defining a relative change in pressure over a first time period and an absolute threshold defining an absolute change in pressure over a second time period;

determining, by the well production control system using the defined triggers, that changes in production improvements exceeding the thresholds have occurred;

determining, by the well production control system, that a production interval has occurred;

re-calibrating, by the well production control system using the real-time updates to the well rates and the flowing bottom-hole pressure data, the multi-segmented well production model;

iterating, using a number of iterations based on learned patterns of correlating the number of iterations with a number of variables, executions of an optimization algorithm of the multi-segmented well production model, including:

executing, by the well production control system using the re-calibrated multi-segmented well production model, the optimization algorithm to determine new optimal inflow control valve (ICV) settings;

comparing, by the well production control system, a flow rate determined from the new optimal ICV settings with a flow rate using previous ICV settings; and determining, by the well production control system based on the comparing and the re-calibrated multi-segmented well production model, that the new optimal ICV settings result in an improvement of production at the multi-segmented oil production facility, the improvement being at least a pre-determined percentage above a production rate using previous ICV settings; and providing, by the well production control system, the optimal ICV settings to a control panel for the multi-segmented oil production facility.

16. The computer-implemented system of claim 15, wherein the multiple flow conditions include commingled testing and individual segment testing.

17. The computer-implemented system of claim 15, wherein the optimization algorithm maximizes multi-segmented well productivity, restricts unwanted water and gas production in the multi-segmented well, and improves sweep efficiency for the multi-segmented well.

18. The computer-implemented system of claim 15, wherein providing the optimal ICV settings to the control panel for the multi-segmented oil production facility includes sending, by a multi-segmented well optimizing system, control commands to the control panel.

19. The computer-implemented system of claim 18, wherein the control commands include commands to change settings for surface ICVs and subsurface ICVs in one or more segments of the multi-segmented well.

20. The computer-implemented system of claim 19, wherein the control commands include choke settings commands to set different choke settings on different ICVs.

\* \* \* \* \*